(12) United States Patent  
Yoshimura

(10) Patent No.: US 7,764,872 B2  
(45) Date of Patent: Jul. 27, 2010

(54) COOLING DEVICE, AND APPARATUS AND METHOD FOR MANUFACTURING IMAGE DISPLAY PANEL USING COOLING DEVICE

(75) Inventor: Masanao Yoshimura, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 600 days.

(21) Appl. No.: 11/676,637

(22) Filed: Feb. 20, 2007

(65) Prior Publication Data

US 2007/0140671 A1 Jun. 21, 2007

Related U.S. Application Data

(62) Division of application No. 11/082,804, filed on Mar. 18, 2005, now Pat. No. 7,239,804.

(30) Foreign Application Priority Data

Mar. 23, 2004 (JP) .............................. 2004-084150

(51) Int. Cl.
*F23B 3/30* (2006.01)
*A21B 1/00* (2006.01)
*G09F 1/10* (2006.01)

(52) U.S. Cl. ..................... 392/418; 219/405; 40/124.01

(58) Field of Classification Search ......... 392/407–418; 219/405, 390–414; 362/33; 40/124.01–124.191; 345/104, 173, 182
See application file for complete search history.

(56) References Cited

U.S. PATENT DOCUMENTS 7,239,804 B2 * 7/2007 Yoshimura ................. 392/418

FOREIGN PATENT DOCUMENTS

| JP | 7-216550 | 8/1995 |
| JP | 2002-270484 | 9/2002 |
| JP | 2003-077398 | 3/2003 |
| JP | 2005-332619 | 12/2005 |

* cited by examiner

*Primary Examiner*—Daniel Robinson
(74) *Attorney, Agent, or Firm*—Fitzpatrick, Cella, Harper & Scinto

(57) ABSTRACT

The present invention provides a cooling device used for a process for heating and cooling a substrate constituting an image display apparatus that uses electron emitting devices. The cooling device includes a cooling plate located opposite the substrate to absorb radiation heat from the substrate. The cooling plate is provided with a high emissivity area in a pattern located opposite to a low emissivity area of the substrate. This suppresses a variation in a temperature distribution in the substrate during cooling, thus preventing the substrate from being distorted or damaged.

4 Claims, 5 Drawing Sheets

COOLING DEVICE, AND APPARATUS AND METHOD FOR MANUFACTURING IMAGE DISPLAY PANEL USING COOLING DEVICE

This is a divisional of application Ser. No. 11/082,804, filed on Mar. 18, 2005.

BACKGROUND OF THE INVENTION

1. Field of the Invention

The present invention relates to a cooling device used for cooling, for example, in a process for manufacturing an electronic or electric apparatus such as an image display panel or a semiconductor device, the cooling device being used after heating a substrate used in the electronic or electric apparatus, as well as an apparatus manufacturing an image display panel using this cooling device and a method for manufacturing a display image panel using the cooling device. More specifically, the present invention relates to a cooling device with which a cooling plate is placed opposite a heated substrate for the electronic or electric apparatus to absorb radiation heat to cool the substrate, as well as an apparatus manufacturing an image display panel using this cooling device and a method for manufacturing a display image panel using the cooling device.

2. Related Background Art

In a conventional process for manufacturing an image display panel or a semiconductor, a substrate is cooled by thermally treating it in a vacuum. The cooling of the heated substrate in the vacuum atmosphere is carried out by absorbing radiation heat (radiant heat) from the substrate. For example, Japanese Patent Application Laid-Open No. H7-216550 discloses a technique in which to cool a substrate in manufacturing a semiconductor, a metal plate is provided parallel with the substrate, while a radiation absorbing layer is formed on a surface opposite to the substrate of the metal plate. The radiation absorbing layer can absorb radiant heat generated by the substrate. Then, the absorbed heat can be transmitted to the metal heat. Moreover, the heat can be discharged via the metal plate.

However, this conventional cooling has problems described below.

First, the temperature of the substrate to be cooled starts to decrease at its peripheral edges, notably in its corner portions, where heat is radiated from its front and back surfaces and side end surfaces. However, an increase in the size of the substrate increases the distance between a central portion and edges of the substrate, thus hindering fast heat transfer. Consequently, there is a large difference in temperature between the peripheral edge, where cooling progresses fast, and the central portion, where cooling is difficult. This temperature distribution associated with the cooling may cause the substrate to be distorted or damaged.

Second, many substrates that require cooling after heating have a member (for example, wiring or phosphor, or the like) provided on a part of a surface of the substrate and which has an emissivity different from that of the substrate itself, for example, as in the case of a substrate (electron source substrate or phosphor substrate) for an image display panel in which an electron source substrate and a phosphor substrate are located opposite each other. A further description will be given taking the case of a substrate for an image display panel. Normally, the substrate is glass, having a relatively high emissivity, and wiring is metal, having a relatively low emissivity. Accordingly, cooling by a cooling plate starts in the vicinities of corner portions of the substrate which are away from an area in which wiring is formed. Thus, disadvantageously, a temperature distribution is created which may cause the substrate to be distorted or damaged. In particular, when the wiring concentrates at a position close to the center of the substrate, the temperature distribution created for the above first reason is further enhanced to crack the substrate.

SUMMARY OF THE INVENTION

A first object of the present invention is to enable easy suppression of a temperature distribution that may be created between a central portion and peripheral edges of a plate material when a cooling plate is placed opposite a heated substrate to absorb radiation heat from the substrate to cool the substrate. A second object of the present invention is to enable easy suppression of a variation in a temperature distribution that may be created in a substrate having a different-emissivity member on at least a part of one surface of the substrate, the member having an emissivity different from that of the substrate, the temperature distribution resulting from a difference in emissivity between the substrate and the different-emissivity member. A third object of the present invention is to enable easy suppression of a variation in a temperature distribution that may be created in a substrate in the manufacture of an image display panel involving heating and cooling of the substrate.

The present invention is a cooling device in which a cooling plate is placed opposite a substrate to absorb radiation heat from the substrate to cool the substrate, the device being characterized in that the cooling plate is provided with a different-emissivity area in a pattern that can suppress a temperature distribution that may be created in the substrate if the substrate is cooled using a cooling plate with a uniform emissivity, the different-emissivity area having an emissivity different from that of other areas.

Further, the present invention is a cooling device in which a cooling plate is placed opposite a substrate having an area with a high emissivity and an area with a low emissivity to absorb radiation heat from the substrate to cool the substrate, the device being characterized in that the cooling plate has an area corresponding to the low-emissivity area of the substrate and having a higher emissivity than other areas (of the cooling plate).

Furthermore, the present invention is an apparatus manufacturing an image display panel, the apparatus comprising a heating device that heats a substrate for the image display panel having a different-emissivity member on at least a part of one surface of the substrate, the member having an emissivity different from that of the substrate, and a cooling device in which a cooling plate is placed opposite the substrate heated by the heating device to absorb radiation heat from the substrate to cool the substrate, the apparatus being characterized in that the cooling plate of the cooling device is provided with a different-emissivity area in a pattern that can suppress a variation in a temperature distribution that may be created in the substrate if the substrate is cooled using a cooling plate with a uniform emissivity, the different-emissivity area having an emissivity different from that of other areas.

Moreover, the present invention is an apparatus manufacturing an image display panel, the apparatus comprising a heating device that heats a substrate having an area with a high emissivity and an area with a low emissivity and a cooling device in which a cooling plate is placed opposite the substrate heated by the heating device to absorb radiation heat from the substrate to cool the substrate, the apparatus being characterized in that the cooling plate of the cooling device has an area corresponding to the low-emissivity area of the substrate and having a higher emissivity than other areas.

Furthermore, the present invention is a method for manufacturing an image display panel, the method comprising the steps of heating a substrate for the image display panel having a different-emissivity member on at least a part of one surface of the substrate, the member having an emissivity different from that of the substrate, and then placing a cooling plate opposite the substrate heated by the heating device to absorb radiation heat from the substrate to cool the substrate, the method being characterized in that the cooling plate has a different-emissivity area in a pattern that can suppress a temperature distribution that may be created in the substrate if the substrate is cooled using a cooling plate with a uniform emissivity, the different-emissivity area having an emissivity different from that of other areas.

Moreover, the present invention is a method for manufacturing an image display panel, the method comprising the steps of heating a substrate having an area with a high emissivity and an area with a low emissivity and then placing a cooling plate opposite the substrate heated by the heating device to absorb radiation heat from the substrate to cool the substrate, the method being characterized in that the cooling plate has an area corresponding to the low-emissivity area of the substrate and having a higher emissivity than other areas (of the cooling plate).

DETAILED DESCRIPTION OF THE PREFERRED EMBODIMENTS

Figure 1:
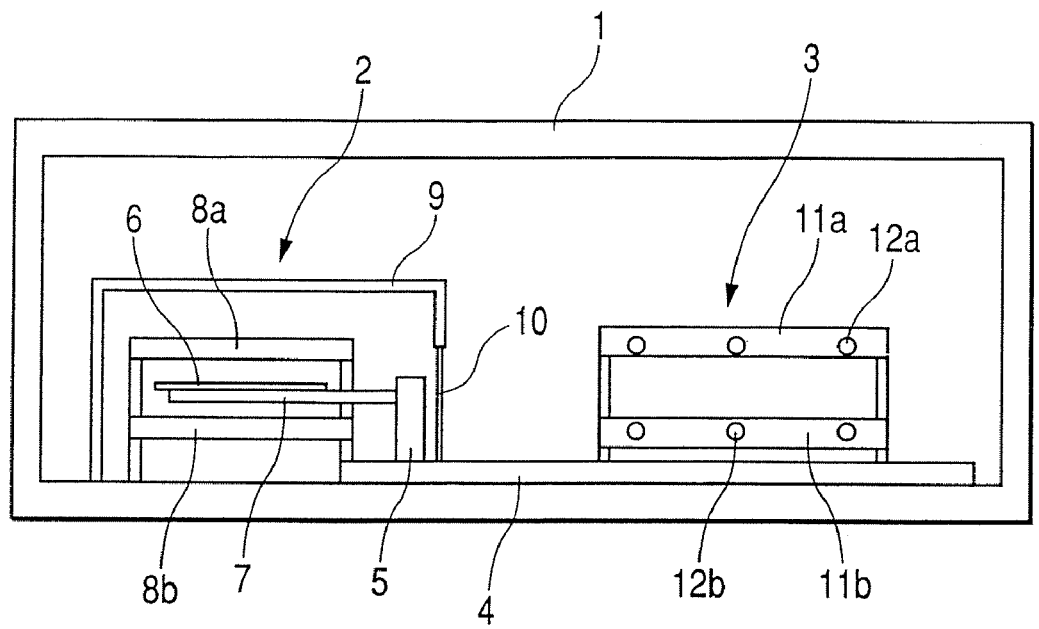
FIG. 1 is a schematic diagram illustrating a substrate being heated and showing a first example of a heating and cooling device having a cooling device according to the present invention which is used as a part of an apparatus manufacturing an image display panel.

The present invention provides a cooling device in which a cooling plate is placed opposite a substrate to absorb radiation heat from the substrate to cool the substrate, the device being characterized in that the cooling plate is provided with a different-emissivity area in a pattern that can suppress a temperature distribution that may be created in the substrate if the substrate is cooled using a cooling plate with a uniform emissivity, the different-emissivity area having an emissivity different from that of other areas.

Furthermore, the present invention is an apparatus manufacturing an image display panel, the apparatus comprising a heating device that heats a substrate for the image display panel having a different-emissivity member on at least a part of one surface of the substrate, the member having an emissivity different from that of the substrate, and a cooling device in which a cooling plate is placed opposite the substrate heated by the heating device to absorb radiation heat from the substrate to cool the substrate, the apparatus being characterized in that the cooling plate of the cooling device is provided with a different-emissivity area in a pattern that can suppress a temperature distribution that may be created in the substrate if the substrate is cooled using a cooling plate with a uniform emissivity, the different-emissivity area having an emissivity different from that of other areas.

Moreover, the present invention is a method for manufacturing an image display panel, the method comprising the steps of heating a substrate for the image display panel having a different-emissivity member on at least a part of one surface of the substrate, the member having an emissivity different from that of the substrate, and then placing a cooling plate opposite the substrate heated by the heating device to absorb radiation heat from the substrate to cool the substrate, the method being characterized in that the cooling plate has a different-emissivity area in a pattern that can suppress a temperature distribution that may be created in the substrate if the substrate is cooled using a cooling plate with a uniform emissivity, the different-emissivity area having an emissivity different from that of other areas.

Further, the present invention is a cooling device in which a cooling plate is placed opposite a substrate having an area with a high emissivity and an area with a low emissivity to absorb radiation heat from the substrate to cool the substrate, the device being characterized in that the cooling plate has an area corresponding to the low-emissivity area of the substrate and having a higher emissivity than other areas.

Moreover, the present invention is an apparatus manufacturing an image display panel, the apparatus comprising a heating device that heats a substrate having an area with a high emissivity and an area with a low emissivity and a cooling device in which a cooling plate is placed opposite the substrate heated by the heating device to absorb radiation heat from the substrate to cool the substrate, the apparatus being characterized in that the cooling plate of the cooling device has an area corresponding to the low-emissivity area of the substrate and having a higher emissivity than other areas.

Furthermore, the present invention is a method for manufacturing an image display panel, the method comprising the steps of heating a substrate having an area with a high emissivity and an area with a low emissivity and then placing a cooling plate opposite the substrate heated by the heating device to absorb radiation heat from the substrate to cool the substrate, the method being characterized in that the cooling plate has an area corresponding to the low-emissivity area of the substrate and having a higher emissivity than other areas.

The term emissivity as used herein refers to the ratio of a radiant quantity from a black body to a radiant quantity from a sample at the same temperature. The emissivity can be measured using a combination of a black body furnace and a spectroradiometer.

According to the present invention, the different-emissivity area provided on the cooling plate enables controlling of the speed at which a substrate surface is cooled. Accordingly, the entire surface can be cooled at an almost uniform speed. It is thus possible to suppress creation of a temperature distribution that may cause the substrate to be distorted or damaged.

Further, according to the present invention, since the different-emissivity area provided on the cooling plate enables controlling of the speed at which a substrate surface is cooled, even if a different-emissivity member such as wiring is provided which has an emissivity different from that of the substrate, it is possible to suppress a temperature distribution that may be created in the substrate owing to the different-emissivity member. As a result, an image display panel with a high yield can be manufactured.

The present invention will be described below with reference to the drawings, taking the case in which a substrate for an image display panel is to be processed.

Figure 2:
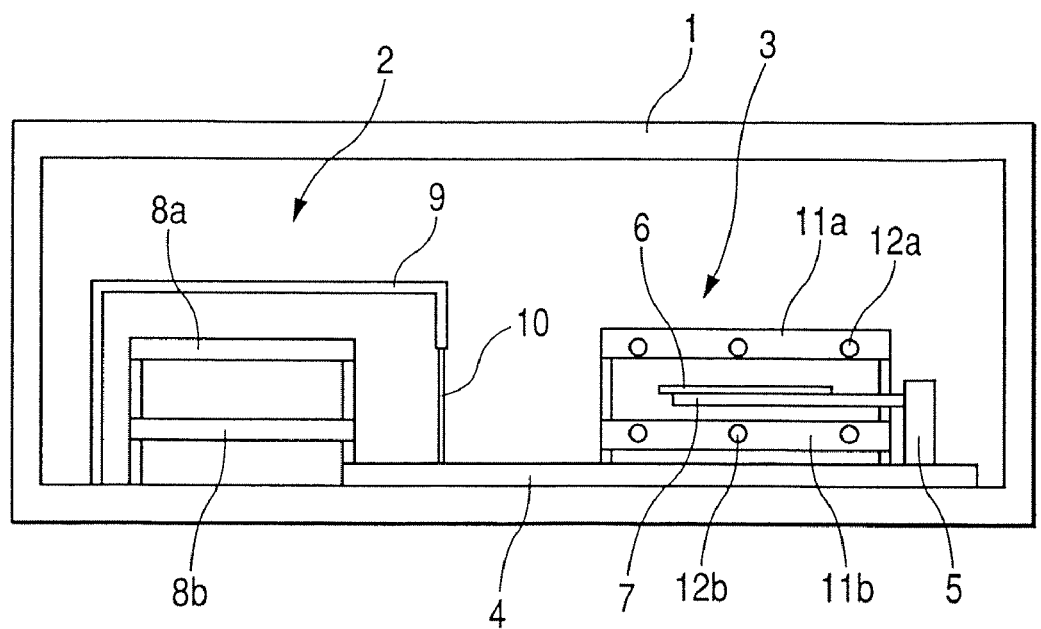
FIG. 2 is a schematic diagram showing how the heating and cooling device in FIG. 1 cools the substrate.
Figure 3:
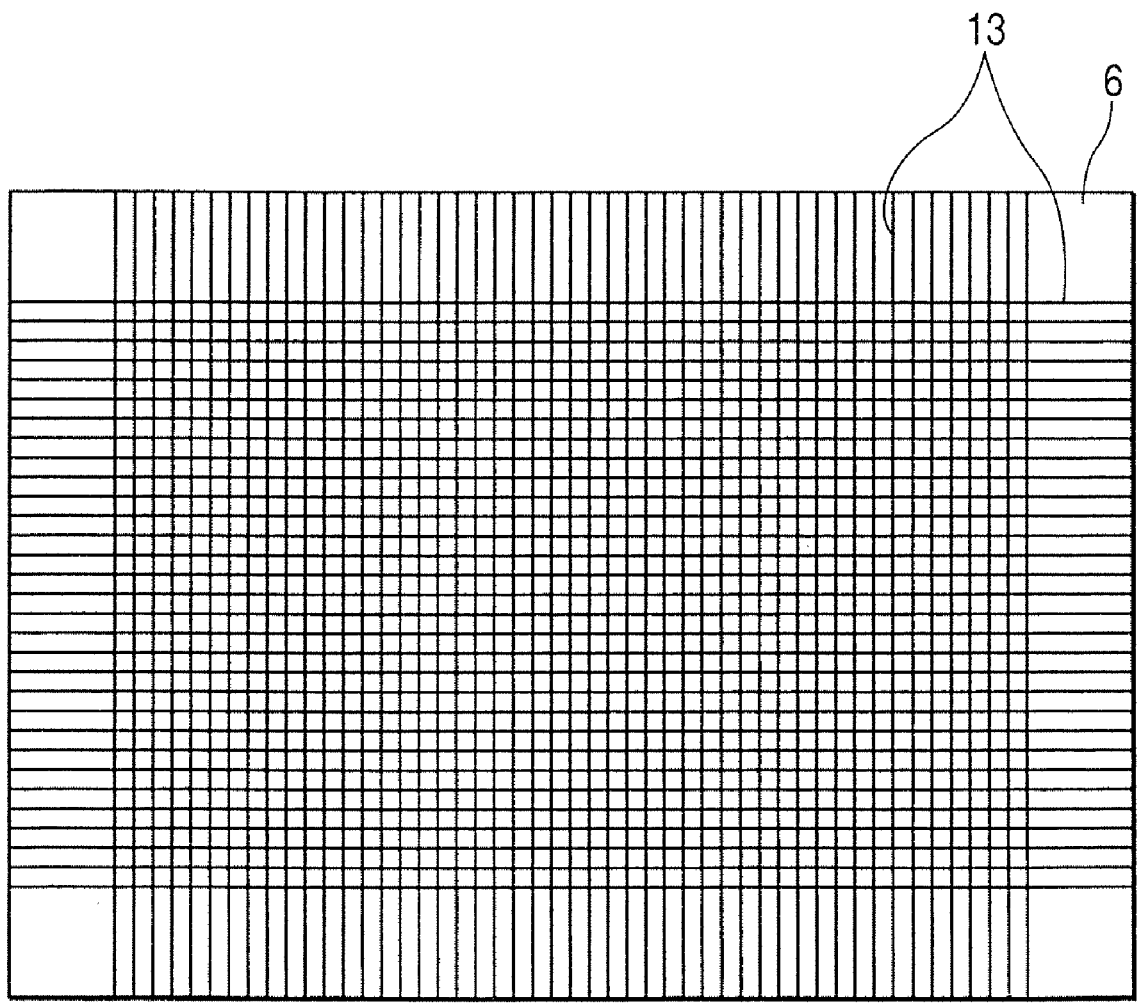
FIG. 3 is a plan view of a substrate having wiring on one surface and which is an example of a processing target.
Figure 4:
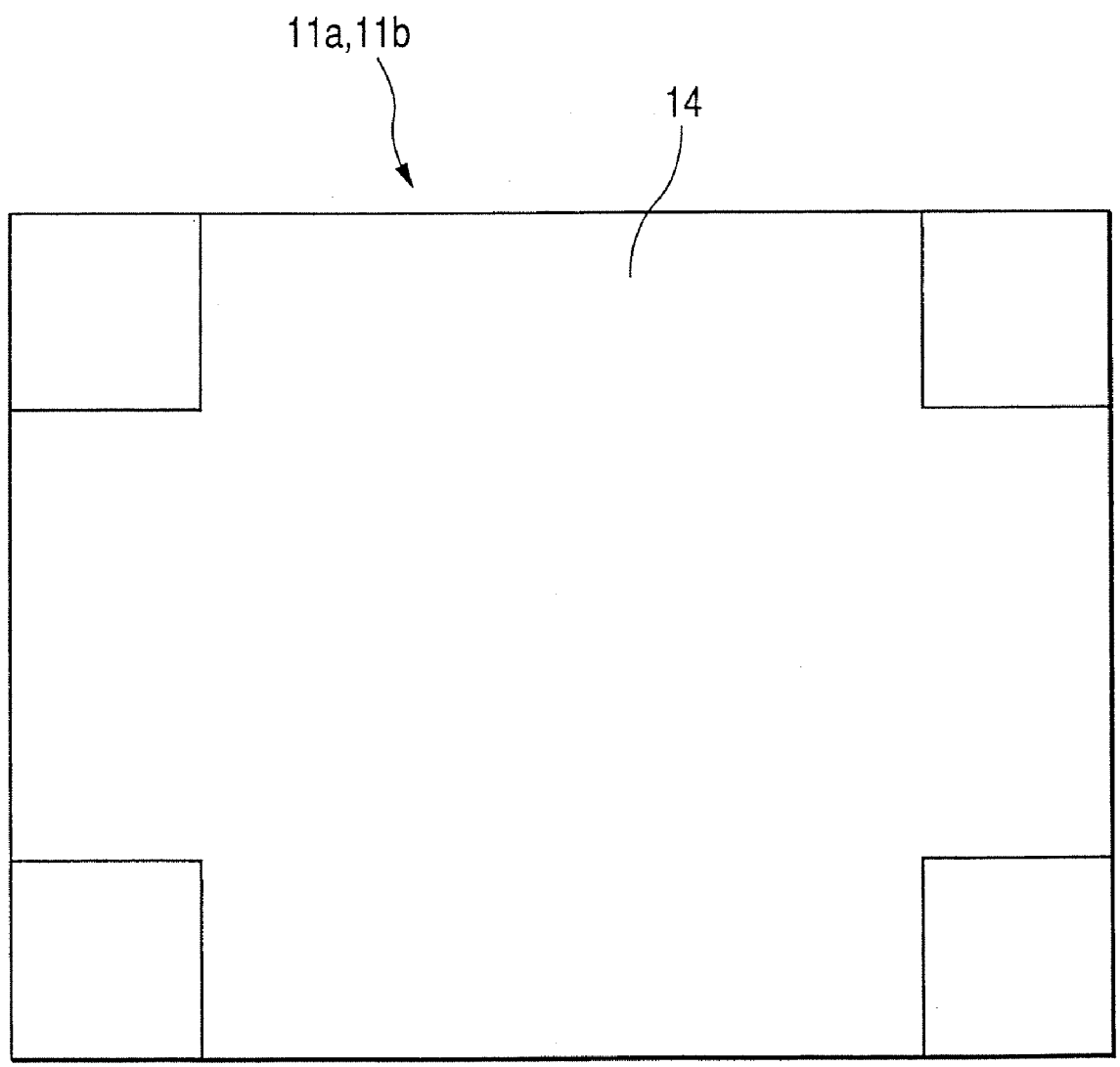
FIG. 4 is diagram showing a pattern of a different-emissivity area provided substantially in association with an area in which the wiring of the substrate shown in FIG. 3 is formed.

FIG. 1 is a schematic diagram illustrating a substrate being heated and showing a first example of a heating and cooling device having a cooling device according to the present invention which is used as a part of an apparatus manufacturing an image display panel. FIG. 2 is a schematic diagram showing how the heating and cooling device in FIG. 1 cools the substrate. FIG. 3 is a plan view of a substrate having wiring on one surface and which is an example of a processing target. FIG. 4 is diagram showing a pattern of a different-emissivity area provided substantially in association with an area in which the wiring of the substrate shown in FIG. 3 is formed.

As shown in FIGS. 1 and 2, the heating and cooling device according to the first example has a heating device 2 and a cooling device 3 separately provided in a vacuum chamber 1 the interior of which is kept in a vacuum atmosphere. A guide 4 is provided between the heating device 2 and the cooling device 3. A driving unit 5 is provided which moves through the vacuum chamber 1 along the guide 4. Further, a substrate 6 for an image display panel to be processed is horizontally supported on a support arm 7 extended from the driving unit 5. The driving unit 5 moves to convey the substrate 6 between the heating device 2 and the cooling device 3.

The heating device 2 comprises a vertical pair of plate-like heaters 8a and 8b, a reflector 9 surrounding both heaters 8a and 8b, and a shutter 10 that is opened and closed when the substrate 6 is loaded into and unloaded from the heating device 2. For the reflector 9 and the shutter 10, both front and back surfaces are composed of a material typified by copper and which has a low emissivity. The reflector 9 and the shutter 10 thus improve the efficiency with which the substrate 6 is heated, while preventing radiation to the exterior of a heated area. This makes it possible to suppress the transfer of heat to the substrate 6 being cooled in the cooling device 3.

When the heating device 2 heats the substrate 6, the shutter 10 is first opened. The driving unit 5 supporting the substrate 6 on the support art 7 is then guided into the reflector 9. Then, the shutter 10 is closed immediately. As shown in FIG. 1, the substrate 6 is then positioned between the heaters 8a and 8b. Then, the heaters 8a and 8b, located opposite a top and bottom surfaces of the substrate 6, generate radiant heat to heat the substrate 6.

For example, in an image display panel in which an electron source substrate and a phosphor substrate are placed opposite each other, the electron source substrate being provided with a plurality of electron emitting devices and matrix wiring used to drive the electron emitting devices, the phosphor substrate being provided with a phosphor that forms an image using an electron beam applied by the electron source substrate, the substrate 6 for an image display panel is used as the electron source substrate or phosphor substrate. The substrate 6 is normally heated a number of times before an image display panel is completely manufactured, in order to form wiring and electron-emitting device components, form a phosphor, and remove adhering components. Further, the substrate 6 heated as described above is normally cooled for the subsequent process.

When the heating and cooling device cools the substrate 6 after the above heating by the heating device 2, the shutter 10 is first opened. The driving unit 5 is taken out of the reflector 9. Then, the shutter 10 is closed immediately. Further, the driving unit 5 supporting the substrate 6 on the support arm 7 is moved to the cooling device 3.

The cooling device 3 is accommodated in the same vacuum chamber 1 in which the heating device 2 is accommodated. The cooling device 3 comprises cooling plates 11a and 11b located opposite the top and bottom surfaces, respectively, of the substrate 6 conveyed and each having an opposite surface larger than the substrate 6. The cooling plates 11a and 11b are composed of a material typified by aluminum or copper and which has a high heat conductivity. The cooling plates 11a and 11b internally comprise cooling paths 12a and 12b, respectively, through which a cooling medium such as cooling water is circulated.

The substrate 6 for an image display panel to be processed according to the present example is an electron source substrate for an image display panel. As shown in FIG. 3, the substrate 6 has a large number of wires 13 densely formed on one surface in a lengthwise and breadthwise direction. The substrate 6 is composed of an insulating material such as glass which has a high emissivity. The wiring 13 is composed of metal such as silver which has a lower emissivity than the substrate 6. In other words, the wiring 13 is a different-emissivity member having an emissivity different from that of the substrate 6. The other surface of the substrate 6 has an almost uniform emissivity; the insulating substance such as glass which has the high emissivity is exposed from the other surface.

The substrate 6 heated by the heating device 2 is conveyed to between the cooling plates 11a and 11b of the cooling device 3 as the driving unit 5 moves as previously described. The cooling plates 11a and 11b, located opposite the top and bottom surfaces, absorb radiation heat to cool the substrate 6. The cooling plates 11a and 11b having absorbed radiation heat from the substrate 6 is cooled by a coolant flowing through the cooling paths 12a and 12b.

If the substrate 6, having the wiring 13, the different-emissivity member, as shown in FIG. 3, is cooled using the cooling plates 11a and 11b, having the opposite surface with the uniform emissivity, then a delay may occur in the cooling of the area in which the wiring 13 formed closely, the different-emissivity member having a lower emissivity than the other areas. On the other hand, corner portions of the substrate 6 from which the surface of the substrate 6, made of glass, having a high emissivity, is exposed are quickly cooled. This is prone to result in a large temperature distribution in the substrate.

The, those surfaces of the cooling plates 11a and 11b of the cooling device 3 according to the present example which are opposite the substrate 6 are provided with a different-emissivity area 14 corresponding to the area in which the wiring 13 is formed and having an emissivity different from that of the other areas. Specifically, the wiring 13, which is the different-emissivity member according to the present example, has a lower emissivity than the substrate 6. Consequently, a delay may occur in the cooling of the area in which the wiring 13 is formed. Thus, the different-emissivity area 14 according to the present example is configured as described below in order to facilitate the absorption of heat from the area in which the wiring 13 is formed, thus increasing cooling speed. The different-emissivity area 14 is provided with, for example, ceramic coating and thus formed to have a higher emissivity than the other areas of the surface opposite to the substrate 6. Further, the different-emissivity area 14 is formed substantially like a cross as shown in FIG. 4. The surface of the base material of the cooling plates 11a and 11b such as aluminum or copper is exposed from the four corners of the cooling plates 11a and 11b; the material has a high heat conductivity but a lower emissivity than the different-emissivity area. This suppresses the absorption of heat from the four corners (areas from which the substrate 6 is exposed) of the surface of the substrate 6 on which the wiring 13 is formed, the four corners being opposite the four corners of the cooling plates 11a and 11b. This, in combination with improvement of the speed at which the wiring 13 formed area is cooled, creation of a temperature distribution on the substrate 6 associated with cooling is suppressed.

If the substrate 6 to be cooled is glass as in the case of the present example, since the glass tends to radiate (absorb) only a limited wavelength of 5 to 20 µ, the emissivity of the substrate 6 of course corresponds to a spectral emissivity ϵλ in an equivalent wavelength region of 5 to 20 µ. Further, the emissivity can be measured at an arbitrary temperature between room temperature and 400° C.; this range corresponds to a process temperature.

The different-emissivity area 14 may be formed so as to match the area in which the wiring 13, the different-emissivity member, is formed. However, since peripheral portions of the substrate 6 are cooled more readily than a central portion of the substrate 6, the different-emissivity area 14 is preferably formed to be smaller than the wiring 13 formed area for balance.

In the above example, the different-emissivity member (in the above example, the wiring 13) has a lower emissivity than the substrate 6. However, if a temperature distribution is created in the substrate 6 owing to the presence, in the substrate, 6 of the different-emissivity member having a lower emissivity than the substrate 6, then the different-emissivity area 14 may have a higher emissivity than the other areas.

The different-emissivity area 14 is most preferably provided on each of the cooling plates 12a and 12b, which are opposite the top and bottom surfaces (front and back surfaces), respectively, of the substrate 6 for an image display panel. However, the different-emissivity area 14 may be provided on only one of the cooling plates 12a and 12b. If the different-emissivity area 14 is provided on only one of the cooling plates 12a and 12b, it is preferably formed on the cooling plate 12a or 12b which is opposite the surface of the substrate on which the different-emissivity member is provided.

In order to reduce the emissivity of all the areas, except the different-emissivity area 14, of the surface of the cooling plates 12a and 12b which are opposite the substrate 6, it is possible to polish these areas.

Figure 5:
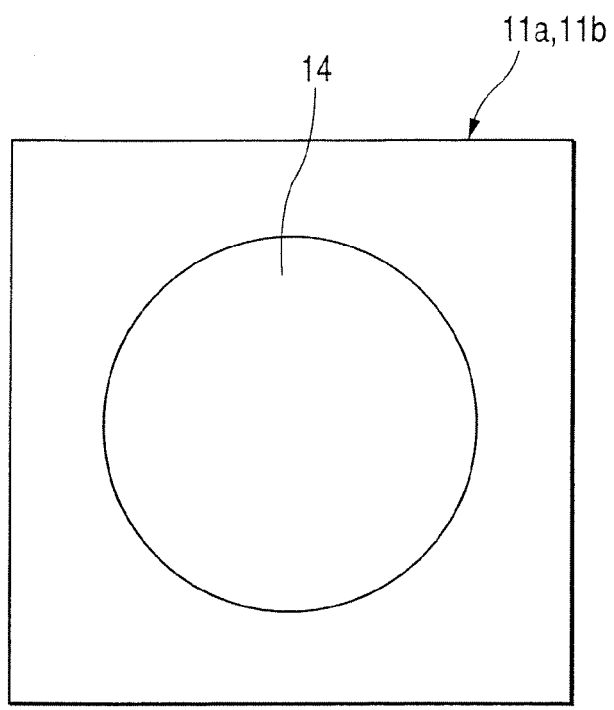
FIG. 5 is a diagram showing another pattern of a different-emissivity area.
Figure 6:
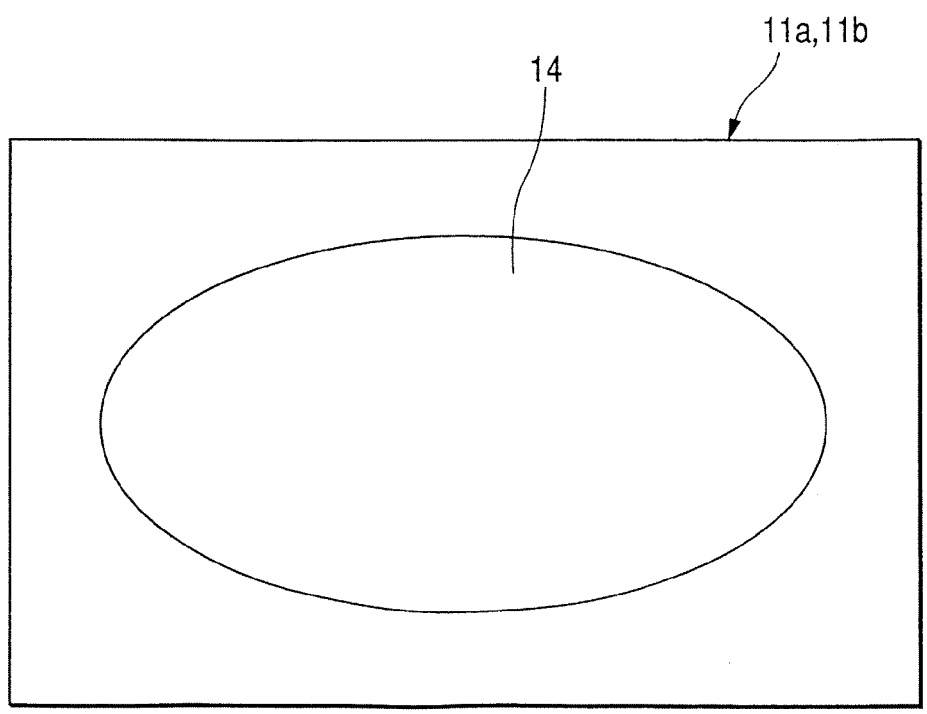
FIG. 6 is a diagram showing yet another pattern of a different-emissivity area.

The substrate 6 for an image display panel is heated and cooled in various conditions during the manufacture of an image display panel. For example, when an electron source substrate or a phosphor substrate, previously described, is manufactured, before electron emitting devices, the wiring 13, a phosphor, and the like are provided, the substrate 6 alone is subjected to a heating process called baking in order to remove adhering components, the heating process being followed by cooling. For the independent substrate 6, both front and back surfaces have an almost uniform emissivity. For the independent substrate 6, a central portion of that surface of each of the cooling plates 12a and 12b which is opposite the substrate 6 is preferably provided with a different-emissivity member 14 which is circular as shown in FIG. 5 or elliptical as shown in FIG. 6 and which has a higher emissivity than the other areas. This facilitates the cooling of the central portion of the substrate 6 which is more difficult to cool than the peripheral edges of the substrate 6, which have large radiating surfaces and which are thus readily cooled. It is thus possible to suppress a temperature distribution that may result from the cooling. The circular different-emissivity area 14 is suitable for an almost square substrate 6. The elliptical different-emissivity area 14 is suitable for a rectangular substrate 6.

Further, if the substrate 6 for an image display panel is an electron source substrate, previously described, then for example, a spacer (not shown) projecting from the wiring 13 formed area may be provided together with the wiring before processing. The spacer is thin and has a very small heat capacity. Consequently, during heating, the spacer is cooled rapidly. Thus, when the spacer is cooled rapidly and the difference in temperature between the spacer and the substrate increases, the spacer is prone to be cracked because of a difference in thermal expansion.

Thus, in connection with the cooling of the substrate 6 for an image display panel in which the spacer is provided on the substrate 6 together with the wiring 13, the different-emissivity area 14, provided substantially in association with the wiring 13 formed area and having a high emissivity, is preferably provided on the cooling plate 11b, which is opposite the back surface of the substrate 6, instead of the cooling plate 11a, which is opposite the surface of the substrate 6 on which the wiring 13 and the spacer are provided. Thus, preferably, the cooling plate 11a does not have the different-emissivity area 14 having a high emissivity.

Figure 7:
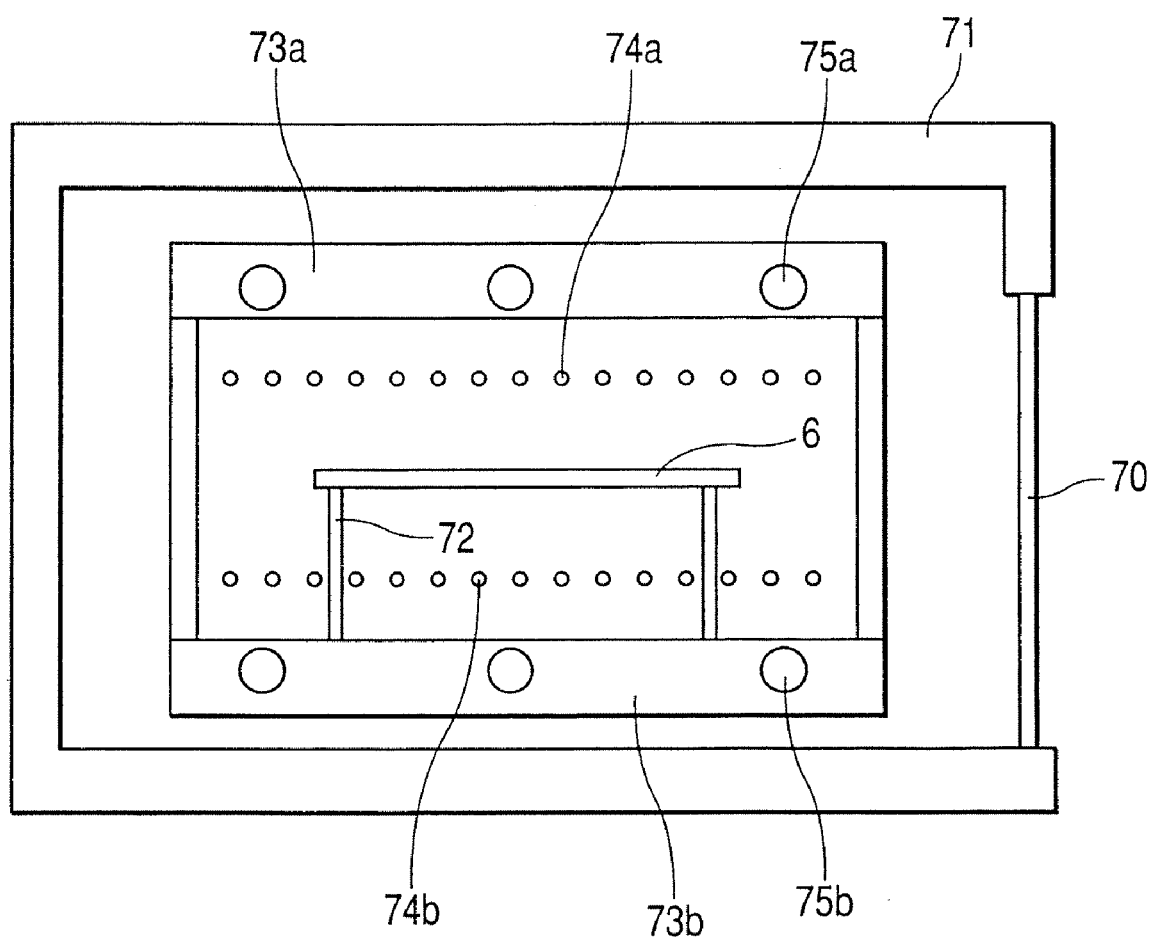
FIG. 7 is a schematic diagram illustrating a second example of a heating and cooling device having a cooling device according to the present invention which is used as a part of an apparatus manufacturing an image display panel.

Now, with reference to FIG. 7, description will be given of a second example of a heating and cooling device having a cooling device according to the present invention which is used as a part of an apparatus manufacturing an image display panel.

The heating and cooling device according to the present example is an integration of the heating device 2 and cooling device 3, shown in FIGS. 1 and 2. The following are provided in a vacuum chamber 71 having a shutter 70 used to move the substrate 6 for an image display panel into and out of the device: support pins 72 used to support the substrate 6 almost horizontally, cooling plates 73a and 73b provided at positions opposite to the top and bottom surfaces, respectively, of the substrate 6 supported by the support pins, and line- or bar-like heaters 74a and heaters 74b installed in parallel between the substrate 6 and each of the cooling plates 73a and 73b, respectively, so that there is a space between the heaters and the substrate 6 and between the heaters and the cooling plate. The cooling plates 73a and 73b have cooling paths 75a and 75b, respectively.

Similarly to the cooling plates 11a and 11b in the first example, the cooling plates 73a and 73b in the present example each have a different-emissivity area 14 (see FIGS. 4 to 6) in accordance with the conditions of the substrate 6.

When the heating and cooling device according to the present example heats the substrate, the shutter 70 is first opened. The substrate 6 is then placed and supported on the support pins 72 between the heaters 74a and the heaters 74b (between the cooling plates 73a and 73b). Then, the heater 74 is actuated with the shutter 70 closed. Further, when the heated substrate 6 is to be cooled, the heaters 74a and 74b are turned off with the substrate 6 unmoved. A coolant is then allowed to flow through the cooling paths 75a and 75b. In the meantime, as described in the first example, the different-emissivity areas 14 provided on the cooling plates 73a and 73b (see FIGS. 4 to 6) are used to suppress a possible temperature distribution in the substrate 6. The heaters 74a and 74b preferably have a circular cross section and are as thin as possible so as to minimize the prevention of absorption of radiation heat from the substrate 6 during the cooling, the absorption being carried out by the cooling plates 73a and 73b.

The present invention is not limited to the substrate 6 described above in the example, that is, glass. The present invention can be implemented in a similar form if, for example, the main material of the cooling target is not glass but something exhibiting a relatively constant spectral emissivity $\epsilon\lambda$ at all the wavelengths, for example, ceramic such as SiC. However, in this case, the emissivity is not the spectral emissivity $\epsilon\lambda$, for which the wavelength is limited, but a total emissivity $\epsilon$. That is, the emissivity according to the present invention corresponds to the spectral emissivity $\epsilon\lambda$ or total emissivity $\epsilon$ depending on the characteristics of the cooling target. Further, measurements are made at a temperature conforming to the process.

This application claims priority from Japanese Patent Application No. 2004-084150 filed Mar. 23, 2004, which is hereby incorporated by reference herein.

What is claimed is:

1. A method for manufacturing an image display panel, the method comprising the steps of heating a substrate having an area with a high emissivity and an area with a low emissivity and then placing a cooling plate opposite the substrate heated by the heating device to absorb radiation heat from the substrate to cool the substrate, the method being characterized in that the cooling plate has an area corresponding to the low-emissivity area of the substrate and having a higher emissivity than other areas of the cooling plate.

2. The method for manufacturing an image display panel according to claim 1, wherein the area with the low emissivity is an area in which a member having a lower emissivity than the substrate is placed on the substrate.

3. The method for manufacturing an image display panel according to claim 2, wherein the member having the lower emissivity than the substrate is wiring.

4. The method for manufacturing an image display panel according to claim 3, wherein a spacer is further placed on one surface of the surface on which the wiring is placed, and the cooling plate is located on a surface of the substrate which is opposite the one surface.

* * * * *